(12) United States Patent
Spoonhower et al.

(10) Patent No.: US 7,272,275 B2
(45) Date of Patent: Sep. 18, 2007

(54) POLARIZED LIGHT EMITTING SOURCE WITH AN ELECTRO-OPTICAL ADDRESSING ARCHITECTURE

(75) Inventors: John P. Spoonhower, Webster, NY (US); David L. Patton, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/096,031

(22) Filed: Mar. 31, 2005

(65) Prior Publication Data

US 2006/0222286 A1 Oct. 5, 2006

(51) Int. Cl.
*G02B 6/26* (2006.01)
*G02B 6/42* (2006.01)
*G09G 3/20* (2006.01)

(52) U.S. Cl. .......................... 385/15; 345/55
(58) Field of Classification Search ..................... None
See application file for complete search history.

(56) References Cited

U.S. PATENT DOCUMENTS

| | | | |
|---|---|---|---|
| 4,281,341 A | 7/1981 | Byatt | |
| 4,523,226 A | 6/1985 | Lipton et al. | |
| 5,956,001 A * | 9/1999 | Sumida et al. | 345/55 |
| 6,028,977 A | 2/2000 | Newsome | |
| 6,459,532 B1 | 10/2002 | Montgomery et al. | |
| 6,485,884 B2 | 11/2002 | Wolk et al. | |
| 6,727,644 B2 | 4/2004 | Hatwar et al. | |
| 2002/0003928 A1 | 1/2002 | Bischel et al. | |
| 2002/0075566 A1 | 6/2002 | Tutt et al. | |
| 2002/0085143 A1 | 7/2002 | Kim et al. | |
| 2002/0094150 A1 | 7/2002 | Lim et al. | |
| 2004/0101822 A1 | 5/2004 | Wiesner et al. | |
| 2004/0109485 A1 | 6/2004 | Flory et al. | |
| 2005/0162749 A1 * | 7/2005 | Ouchi | 359/634 |

OTHER PUBLICATIONS

Ming-Chang M. Lee et al.; "A MEMS-Acutated Tunable Microdisk Resonator".*

(Continued)

*Primary Examiner*—Michelle Connelly-Cushwa
*Assistant Examiner*—Chris H. Chu
(74) *Attorney, Agent, or Firm*—Frank Pincelli

(57) ABSTRACT

A light source device, system and method of operating and viewing a polarized light source device. The light source device comprising a support substrate, a plurality of light emitting asymmetrical light emitting resonators placed in a matrix on the support substrate forming a plurality of rows and columns of the asymmetrical light emitting resonators, a plurality of light waveguides positioned on the substrate such that each of the asymmetrical light emitting resonators is associated with an electro-coupling region with respect with to one of the plurality of light waveguides, a deflection mechanism for causing relative movement between a portion of at least one of the plurality of light waveguides and the associated asymmetrical light emitting resonator so as to control when the asymmetrical light emitting resonator is in the electro-coupling region, and a light source associated with each of the plurality of light waveguides for transmitting a light along the plurality of light waveguides for selectively activating each of the asymmetrical light emitting resonators when positioned within the electro-coupling region. A viewing device is provided for viewing the polarized light display.

55 Claims, 15 Drawing Sheets

OTHER PUBLICATIONS

Sun-Kyung Kim et al.; "Highly Directional Emission From Few-Micron Sized Elliptical Microdisks"; 2004.*

Ming-Chang M. Lee et al.; A MEMS-Actuated Tunable Microdisk Resonator; Electrical Engineering Department, University of California, Los Angeles.

W. Y. Chen et al.; High-Finesse Laterally Coupled Single-Mode Benzocyclobutene Microring Resonators; IEEE Photonics Technology Letters, vol. 16, No. 2, Feb. 2004; pp. 470-472.

Joyce K. S. Poon et al.; Wide-Range Tuning of Polymer Microring Resonators by the Photobleaching of CLD-1 Chromophores; Optics Letters, vol. 29, No. 22, Nov. 15, 2004; pp. 2584-2586.

Xuefeng Wang et al.; Liquid Crystal Polymer (LCP) for MEMS: Processes and Applications; Journal of Micromechanics and Microengineering; May 2003; pp. 628-633.

"FDTD Microcavity Simulations: Design and Experimental Realization Of Waveguide-Coupled Single-Mode Ring and Whispering-Gallery-Mode Disk Resonators" by S.C. Hagness et. al., Journal of Lightwave Technology, vol. 15, No. 11, pp. 2154-2165.

Chung-yeh Chao et al.; Polymer Microring Resonatoers Fabricated by Nanoimprint Technique; J. Vac. Sci. Technol. B 20(6), Nov./Dec. 2002; pp. 2862-2866.

Sun-Kyung Kim et al. Highly Directional Emission From Few-Micron-Size-Elliptical Microdisks; Feb. 9, 2004; pp. 861-863, vol. 84, No. 6.

"Microring and microdisk optical resonators using silicon nanocrystals and erbium prepared using silicon technology", by Donald S. Gardner et al., Optical Materials vol. 27, No. 5, Oct. 18, 2004 pp. 804-811, ISSN; 0925-3467.

* cited by examiner

POLARIZED LIGHT EMITTING SOURCE WITH AN ELECTRO-OPTICAL ADDRESSING ARCHITECTURE

CROSS REFERENCE TO RELATED APPLICATIONS

U.S. Ser. No. 11/095167, filed concurrently herewith, of John P. Spoonhower, and David Lynn Patton entitled "Visual Display With Electro-Optical Addressing Architecture", U.S. Ser. No. 11/096032, filed concurrently herewith, of John P. Spoonhower, David Lynn Patton and Frank Pincelli, entitled "Visual Display With Electro-Optical Individual Pixel Addressing Architecture", and U.S. Ser. No. 11/094855, filed concurrently herewith, of John P. Spoonhower, and David Lynn Patton entitled "Placement Of Lumiphores Within A Light Emitting Resonator In A Visual Display With Electro-Optical Addressing Architecture".

FIELD OF THE INVENTION

A flat panel light source wherein optical waveguides and other thin film structures are used to distribute (address) excitation light to a patterned array of light emitting pixels.

BACKGROUND OF THE INVENTION

A flat panel light source system is based on the generation of photo-luminescence within a light cavity structure. Optical power is delivered to the light emissive pixels in a controlled fashion through the use of optical waveguides and a novel addressing scheme employing Micro-Electro-Mechanical Systems (MEMS) devices. The energy efficiency of the light source results from employing efficient, innovative photo-luminescent species in the emissive pixels and from an optical cavity architecture, which enhances the excitation processes operating inside the pixel. The present system is thin, light weight, power efficient and cost competitive to produce when compared to existing technologies. Further advantages realized by the present system include high brightness in varying lighting conditions; high color gamut; viewing angle independence, size scalability without brightness and color quality sacrifice, rugged solid-state construction, vibration insensitivity and size independence. The present invention has potential applications in military, personal computing and digital HDTV systems, multi-media, medical and broadband imaging displays and large-screen display systems. Defense applications may range from full-color, high-resolution, see-through binocular displays to 60-inch diagonal digital command center displays. The new light source system employs the physical phenomena of photo-luminescence in a flat-panel light source system.

Conventional transmissive liquid crystal displays (LCDs) use a white backlight, together with patterned color filter arrays (CFAs), to create colored pixel elements as a means of displaying color. Polarizing films polarize light. The pixels in a conventional liquid crystal display are turned on or off through the use of an additional layer of liquid crystals in combination with two crossed polarizer structures on opposite sides of a layer of polarizing liquid crystals. When placed in an electrical field with a first orientation, the additional liquid crystals do not alter the light polarization. When the electrical field is changed to a second orientation, the additional liquid crystals alter the light polarization. When light from the polarizing liquid crystals is oriented at ninety degrees to the orientation of the polarizing film in a first orientation, no light passes through the display, hence, creating a dark spot. In a second orientation, the liquid crystals do rotate the light polarization; hence, light passes through the crystals and polarizing structures to create a bright spot having a color as determined by the color filter array.

This conventional design for creating a display suffers from the need to use a polarizing film to create polarized light. Approximately one half of the light is lost from the backlight; thus, reducing power efficiency. Just as significantly, imperfect polarization provided by the polarizing film reduces the contrast of the display. Moreover, the required additional use of a color filter array to provide colored light from a white light source further reduces power efficiency. If each color filter for a tri-color red, green, and blue display passes one third of the white light, then two thirds of the white light is lost. Therefore, at least 84% of the white light generated by a backlight is lost.

The use of organic light emitting diodes (OLEDs) to provide a backlight to a liquid crystal display is known. For example, U.S. Patent Application Publication No. 2002/0085143 A1, by Jeong Hyun Kim et al., published Jul. 4, 2002, titled "Liquid Crystal Display Device And Method For Fabricating The Same," describes a liquid crystal display (LCD) device, including a first substrate and a second substrate; an organic light emitting element formed by interposing a first insulating layer on an outer surface of the first substrate; a second insulating layer and a protective layer formed in order over an entire surface of the organic light emitting element; a thin film transistor formed on the first substrate; a passivation layer formed over an entire surface of the first substrate including the thin film transistor; a pixel electrode formed on the passivation layer to be connected to the thin film transistor; a common electrode formed on the second substrate; and a liquid crystal layer formed between the first substrate and the second substrate.

A method for fabricating the LCD in U.S. Patent Application Publication No. 2002/0085143 A1 includes the steps of forming a first insulating layer on an outer surface of a first substrate; forming an organic light emitting element on the first insulating layer; forming a second insulating layer over an entire surface of the organic light emitting element; forming a protective layer on the second insulating layer; forming a thin film transistor on the first substrate; forming a passivation layer over an entire surface of the first substrate including the thin film transistor; forming a pixel electrode on the passivation layer; and forming a liquid crystal layer between the first substrate and a second substrate. However, this prior art design does not disclose a means to increase the efficiency of the LCD.

U.S. Pat. No. 6,485,884 issued Nov. 26, 2002 to Martin B. Wolk et al., titled "Method For Patterning Oriented Materials For Organic Electronic Displays And Devices" discloses the use of patterned polarized light emitters as a means to improve the efficiency of a display. The method includes selective thermal transfer of an oriented, electronically active, or emissive material from a thermal donor sheet to a receptor. The method can be used to make organic electroluminescent devices and displays that emit polarized light. There remains a problem, however, in that there continues to exist incomplete orientation of the electronically active or emissive material from a thermal donor sheet to a receptor. Hence, the polarization of the emitted light is not strictly linearly polarized, therefore, the light is incompletely polarized.

There is a need, therefore, for an alternative backlight design that improves the efficiency of polarized light production, thus and thereby improving the overall efficiency of a liquid crystal display that incorporates the alternative backlight.

Stereoscopic displays are also known in the art. These displays may be formed using a number of techniques; including barrier screens such as discussed by Montgomery in U.S. Pat. No. 6,459,532 and optical elements such as lenticular lenses as discussed by Tutt et al in U.S. Patent Application Publication No. 2002/0075566. Each of these techniques concentrates the light from the display into a narrow viewing angle, providing an auto-stereoscopic image. Unfortunately, these techniques typically reduce the perceived spatial resolution of the display since half of the columns in the display are used to display an image to either the right or left eye. These displays also reduce the viewing angle of the display, reducing the ability for multiple users to share and discuss the stereoscopic image that is being shown on the display.

Among the most commercially successful stereoscopic displays to date have been displays that either employed some method of shuttering light such that the light from one frame of data is able to enter only the left or right eye and left and right eye images are shown in rapid succession. Two methods have been employed in this domain; including displays that employ active shutter glasses or passive polarizing glasses. Systems employing shutter glasses display either a right or left eye image while an observer wears active LCD shutters that allow the light from the display to pass to only the appropriate eye. While this technique has the advantage that it allows a user to see the full resolution of the display and allow the user to switch from a monoscopic to a stereoscopic viewing mode, the update rate of the display is typically on the order of 120 Hz, providing a 60 Hz image to each eye. At this relatively low refresh rate, most observers will experience flicker resulting in significant discomfort if the display is used for more than a few minutes within a single viewing session. Even when the display is refreshed at significantly higher rates, flicker is often visible when the display is large and/or high in luminance.

Byatt, 1981 (U.S. Pat. No. 4,281,341) has described a system employing a switchable polarizer that is placed in front of a CRT and performs very similarly to shutter glasses, using the polarization to select which eye will see each image. This system has the advantage over shutter glasses that the user does not need to wear active glasses, but otherwise suffers from the same deficiencies, including flicker.

Lipton, 1985 (U.S. Pat. No. 4,523,226) described a display system that will not suffer from flicker, but instead uses two separate video displays and optics to present the images from the two screens appropriately for the two eyes. While this display system does not suffer from the same visual artifacts as the system employing switchable polarization that was described by Byatt, the system requires two separate visual displays and additional optics, providing increasing the cost of such a system.

Previously, Newsome disclosed the use of upconverting phosphors and optical matrix addressing scheme to produce a visible display in U.S. Pat. No. 6,028,977. Upconverting phosphors are excited by infrared light; this method of visible light generation is typically less efficient than down-conversion (luminescent) methods like direct fluorescence or phosphorescence, to produce visible light. The present invention differs from the prior art in that a different addressing scheme is employed to activate light emission from a particular emissive pixel. The method and device disclosed herein do not require that two optical waveguides intersect at each light emissive pixel. Furthermore, novel optical cavity structures, in the form of asymmetrical light emitting resonators, are disclosed for the emissive pixels in the present invention.

Additionally, in U.S. Patent Application Publication No. US2002/0003928A1, Bischel et al. discloses a number of structures for coupling light from the optical waveguide to a radiating pixel element. The use of reflective structures to redirect some of the excitation energy to the emissive medium is disclosed. In the present invention, we disclose the use of novel asymmetrical optical cavity structures, in the form of elliptical ring, so-called racetrack, or elliptical disk resonators, the resonators themselves modified to affect the emission of visible light.

Recently, the optical properties of asymmetrical microdisk resonators have been disclosed in "Highly Directional Emission From Few-Micron-Size Elliptical Microdisks", Applied Physics Letters, 84, 6, ppg. 861-863 (2004), by Sun-Kyung Kim, et al. Such asymmetrical structures exhibit polarized light emission with the axis of polarization parallel to the major axis of the elliptical structure. The use of such asymmetrical structures to produce polarized light sources is a novel feature of the present invention.

The use of such resonators further allows for a novel method of control of the emission intensity, through the use of Micro-Electro-Mechanical Systems (MEMS) devices to alter the degree of power coupling between the light power delivering waveguide and the emissive resonator pixel. Such means have been disclosed in control of the power coupling to opto-electronic filters for telecommunications applications. In this case, the control function is used to tune the filter. Control over the power coupling is described in "A MEMS-Actuated Tunable Microdisk Resonator", by Ming-Chang M. Lee and Ming C. Wu, paper MC3, 2003 IEEE/LEOS International Conference on Optical MEMS, 18-21 August 2003.

SUMMARY OF THE INVENTION

In accordance with one aspect of the present invention there is provided a light source device, comprising:

a. a support substrate;

b. a plurality of asymmetrical light emitting resonators placed in a matrix on said support substrate forming a plurality of rows and columns of said asymmetrical light emitting resonators;

c. a plurality of light waveguides positioned on said substrate such that each of said asymmetrical light emitting resonators is associated with an electro-coupling region with respect with to one of said plurality of light waveguides;

d. a deflection mechanism for causing relative movement between a portion of at least one of said plurality of light waveguides and said associated asymmetrical light emitting resonator so as to control when said asymmetrical light emitting resonator is in the electro-coupling region; and e. a light source associated with each of the plurality of light waveguides for transmitting a light along the plurality of light waveguides for selectively activating each of the asymmetrical light emitting resonators when positioned within the electro-coupling region.

In accordance with another aspect of the present invention there is provided a method for controlling visible light emitting from a light source device having plurality of asymmetrical light emitting resonators placed in a pattern forming a plurality of rows and columns and a plurality of wave light guides positioned so that each of the asymmetrical light emitting resonators is positioned adjacent one of the plurality of wave light guides; comprising the steps of:

a. providing a light source associated with each of the plurality of light waveguides for transmitting a light along the associated light waveguide;

b. providing deflection mechanism for causing relative movement between a portion of at least one of the plurality of light waveguides and the associated asymmetrical light emitting resonator so as to control when the asymmetrical light emitting resonator is in the electro-coupling region;

c. selectively controlling emission of visible light from the plurality of asymmetrical light emitting resonators by controlling the deflection mechanism and light source such that when the asymmetrical light emitting resonator in the electro-coupling region and a light is transmitted along the associated light waveguide the emission of visible light will occur.

In accordance with yet another aspect of the present invention there is provided a system for viewing a stereoscopic image, comprising:

a. an image display device, having a plurality of asymmetrical light emitting resonators placed in a matrix, each of the plurality of asymmetrical light emitting resonators having a major axis and a minor axis, the plurality of asymmetrical light emitting resonators being placed in a pattern such that an polarized image is produced in two different polarized directions;

b. a viewing device having a polarizing element for viewing the polarized image for each of the different polarized directions.

In accordance with still another aspect of the present invention there is provided a display device for producing an stereoscopic image, comprising:

a plurality of asymmetrical light emitting resonators placed in a matrix, each of the plurality of asymmetrical light emitting resonators having a major axis and a minor axis, the plurality of asymmetrical light emitting resonators being placed in a pattern such that a polarized image is produced in two different polarized directions.

In accordance with another aspect of the present invention there is provided a method for producing a stereoscopic image, comprising the steps of:

a. providing a single image display device having a plurality of asymmetrical light emitting resonators placed in a pattern that produces an image two different polarized directions.

These and other aspects, objects, features and advantages of the present invention will be more clearly understood and appreciated from a review of the following detailed description of the preferred embodiments and appended claims and by reference to the accompanying drawings.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

DETAILED DESCRIPTION OF THE INVENTION

Figure 1:
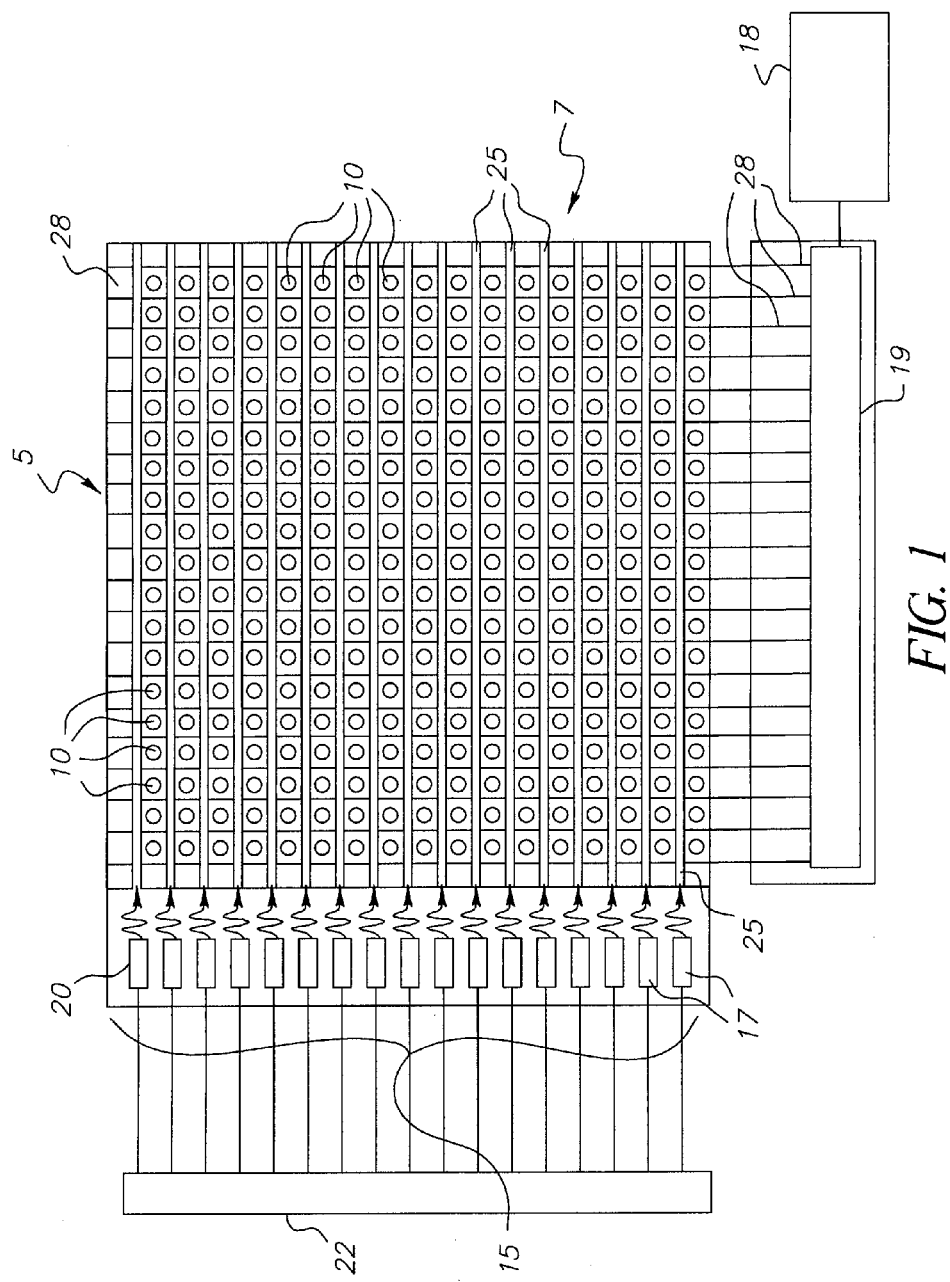
FIG. 1 is a schematic top view of an optical flat panel light source made in accordance with the present invention.

Referring to FIGS. 1-2 there is illustrated a photo-luminescent light source 5 system made in accordance with the present invention. The light source 5 system functions by converting excitation light to emitted, light. In the embodiment illustrated each pixel 10 in light source 5 is comprised of one or more sub-pixels; sub-pixels are typically comprised of a red sub-pixel 11, a green sub-pixel 12, and a blue sub-pixel 13, as shown in FIG. 2. Colors other than red, green, and blue are caused by the admixture of these primary colors; thus controlling the intensity of the individual sub-pixels adjusts both the brightness and color of a pixel 10. Those skilled in the art understand that other primary color selections are possible and will lead to a full color light source. Color generation in the light source is a consequence of the mixing of multiple-wavelength light emissions by the viewer. This mixing is accomplished by the viewer's integration of spatially distinct, differing wavelength light emissions from separate sub-pixels that are below the spatial resolution limit of the viewer's eye. Typically a color light source has red, green, and blue separate and distinct sub-pixels, comprising a single variable color pixel. Monochrome light sources may be produced by the use of a single color pixel 10 or sub-pixel (11,12, 13), or by constructing a single pixel capable of emitting "white" light. The spectral characteristics of a monochrome light source pixel will be determined by the choice of lumiphore or combination of lumiphores. White light generation can be accomplished through the use of multiple doping schemes for the asymmetrical light emitting resonator 30 as described by Hatwar and Young in U.S. Pat. No. 6,727,644B2. Generation of white light is appropriate for the production of backlight light sources used in combination with liquid crystal layers to produce a Liquid Crystal Display (LCD). Photo-luminescence is used to produce the separate wavelength emission from each pixel (or subpixel) element. The photo-luminescence may be a result of a number of physically different processes including, multi-step, photonic up-conversion processes and the subsequent radiative emission process, direct optical absorption and the subsequent radiative emission process, or optical absorption followed by one or more energy transfer steps, and finally, the subsequent radiative emission process. Use of combinations of these processes may also be considered to be within the scope of this invention.

FIG. 1 is schematic top view of an optical flat panel light source 5 made in accordance with the present invention. The light source 5 contains an array 7 of light emitters comprised of a matrix of pixels 10 each having an asymmetrical light emitting resonator 30 (shown in FIGS. 2A, B, and C) located at each intersection of an optical row waveguide 25 and column electrodes 28. A power source 22 is used to activate the light source array 15. The light source array 15 provides optical power or light 20, used to excite the photo-luminescent process in each pixel 10. Typical light source array elements 17 may be diode lasers, infrared laser, light emitting diodes (LEDs), and the like. These may be coherent or incoherent light sources. These may be ultraviolet, visible, or infrared, light sources. There may be a one-to-one correspondence between the light source array element 17, and an optical row waveguide 25, or alternatively, there may be a single light source array element 17 multiplexed onto a number of optical row waveguides 25, through the use of an optical switch to redirect the light 20 output from the single light source array element 17.

A principal component of the photo-luminescent flat panel light source system 5 is the optical row waveguide 25, also known as a dielectric waveguide. Two key functions are provided by the waveguides 25. They confine and guide the optical power to the pixel 10. Several channel waveguide structures have been illustrated in U.S. Pat. No. 6,028,977. The optical waveguides must be restricted to TM and TE propagation modes. TM and TE mode means that optical field orientation is perpendicular to the direction of propagation. Dielectric waveguides confining the optical signal in this manner are called channel waveguides. The buried channel and embedded strip guides are applicable to the proposed light source technology. Each waveguide consists of a combination of cladding and core layer. These layers are fabricated on either a glass-based or polymer-based substrate. The core has a refractive index greater than the cladding layer. The core guides the optical power past the resonator in the absence of power coupling. With the appropriate adjustment of the distance between the optical row waveguide 25 and the asymmetrical light emitting resonator 30, power is coupled into the asymmetrical light emitting resonator 30. At the asymmetrical light emitting resonator 30 the coupled optical light power drives the resonator materials into a luminescent state. The waveguides 25 and resonators 30 can be fabricated using a variety of conventional techniques including microelectronic techniques like lithography. These methods are described, for example, in "High-Finesse Laterally Coupled Single-Mode Benzocyclobutene Microring Resonators" by W. -Y. Chen, R. Grover, T. A. Ibrahim, V. Van, W. N. Herman, and P. -T. Ho, IEEE Photonics Technology Letters, 16(2), p. 470. Other low-cost techniques for the fabrication of polymer waveguides can be used such as imprinting, and the like. Nano-imprinting methods have been described in "Polymer microring resonators fabricated by nanoimprint technique" by Chung-yen Chao and L. Jay Gao, J. Vac. Sci. Technol. B 20(6), p. 2862. Photobleaching of polymeric materials as a fabrication method has been described by Joyce K. S. Poon, Yanyi Huang, George T. Paloczi, and Amnon Yariv, in "Wide-Range Tuning Of Polymer Microring Resonators By The Photobleaching Of CLD-1 Chromophores" by, Optics Letters 29(22), p. 2584. This is an effective method for post fabrication treatment of optical micro-resonators. A wide variety of polymer materials are useful in this and similar applications. Theses can include fluorinated polymers, polymethylacrylate, liquid crystal polymers, and conductive polymers such as polyethylene dioxythiophene, polyvinyl alcohol, and the like. These materials and additionally those in the class of liquid crystal polymers are suitable for this application (see "Liquid Crystal Polymer (LCP) for MEMs", by X. Wang et. al., J. Micromech. MicroEng, 13, (2003), p. 628-633.) This list is not intended to be all inclusive of the materials that may be employed for this application.

Excitation of the asymmetrical light emitting resonator 30 (shown in FIGS. 2A, B, and C) by the row waveguide 25 under the control of the column voltage source 18 and column electrodes 28 causes the asymmetrical light emitting resonator 30 to emit light. The excitation of the asymmetrical light emitting resonator 30 is caused by optical pumping action of the light 20 shown in FIG. 1 from a row light source array element 17 through the row waveguide 25 and controlling voltage to the column electrodes 28 by multiplex controller 19 from a column voltage source 18. The excitation process is a coordinated row-column, electrically activated, optical pumping process called electro-optical addressing. Those skilled in the art know that the roles of columns and rows are fully interchangeable without affecting the performance of this light source 5.

Figure 2A:
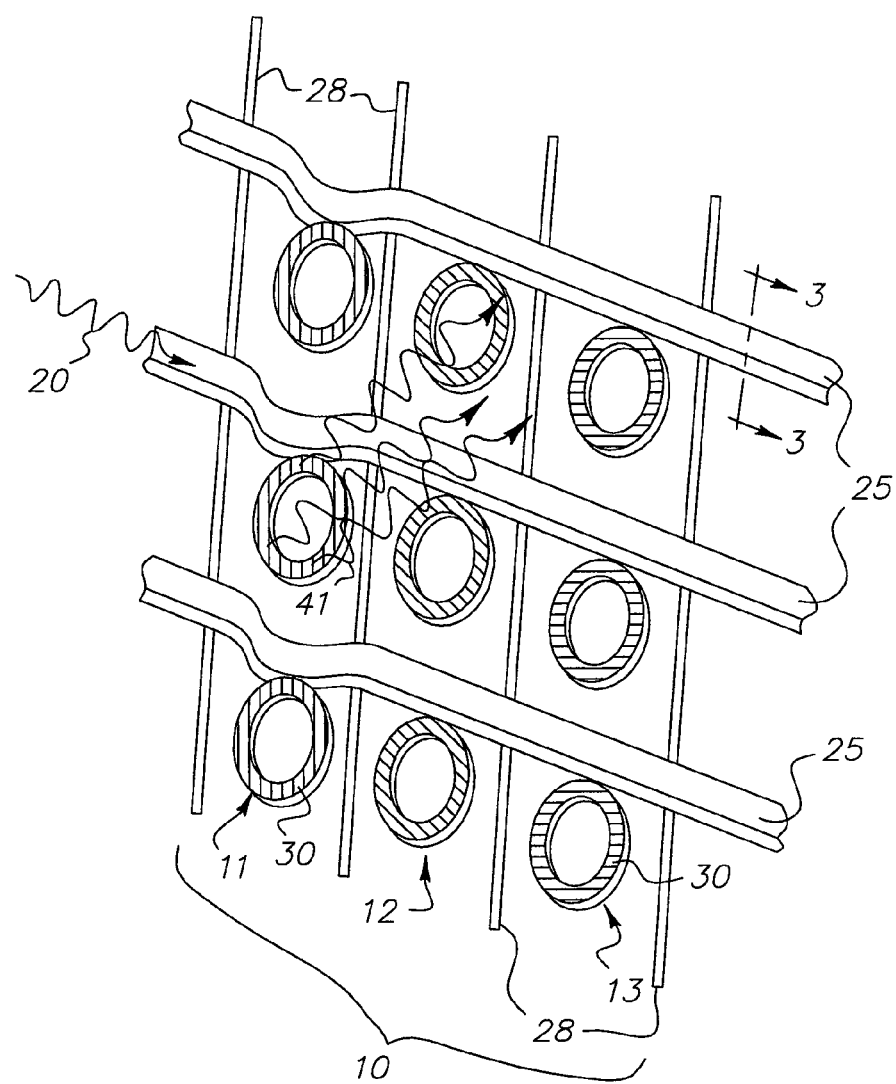
FIGS. 2A, 2B and 2C are enlarged top plan views of red light, green light and blue light emitting asymmetrical resonators for a color light source made in accordance with the present invention.

Now referring to FIG. 2A, electro-optical addressing is defined as a method for controlling an array 7 (not shown) of asymmetrical light emitting resonators 30 that form the optical flat panel light source 5 (see FIG. 1). In FIG. 2A, a pixel 10 comprised of three sub-pixels, 11, 12, and 13 is shown. In electro-optical addressing, the selection of a particular pixel that appears to be light emitting is accomplished by the specific combination of excitation of light in a particular optical row waveguide 25, and voltage applied to a particular set of column electrodes 28.

The asymmetrical light emitting resonator 30 is excited into a photo-luminescent state through the absorption of light 20 as a result of the close proximity to the row waveguides 25. The physics of the coupling of energy between the resonator 30 and the optical row waveguide 25 is well known in the art. It is known to depend critically upon the optical path length between the row waveguide 25 and the asymmetrical light emitting resonator 30; it can therefore be controlled by the distance (h, shown in FIGS. 6A and 6B) separating the two structures or by various methods of controlling the index of refraction. Typical methods for control of the index of refraction include heat, light, and electrical means; these are well known. These methods correspond respectively to the thermo-optic, photorefractive, and electro-optic methods. The invention disclosed herein makes use of control of the distance parameter via a MEMS device to control the energy coupling, and thus affect the intensity of photo-luminescent light generated in the pixel 10. In an example, the asymmetrical light emitting resonator 30 is composed of a light transmissive material but incorporating (doped with) a light emitting photo-luminescent species. The base material (the material excluding the photo-luminescent species or dopant) for the asymmetrical light emitting resonator may be the same or different from the optical row waveguide 25 material. Typical base materials can include glasses, semiconductors, or polymers.

Photo-luminescent species or dopants can include various fluorophores, or phosphors including up-converting phosphors. The selection of a particular dopant or dopants will primarily determine the emission spectrum of a particular asymmetrical light emitting resonator 30. These lumiphores (fluorophores or phosphors) may be inorganic materials or organic materials. The asymmetrical light emitting resonator 30 can include a combination of dopants that cause it to respond to the electro-optic addressing by emitting visible radiation. Dopant or dopants include the rare earth and transition metal ions either singly or in combinations, organic dyes, light emitting polymers, or materials used to make Organic Light Emitting Diodes (OLEDs). Additionally, lumiphores can include such highly luminescent materials such as inorganic chemical quantum dots, such as nano-sized CdSe or CdTe, or organic nano-structured materials such as the fluorescent silica-based nanoparticles disclosed in U.S. Patent Application Publication No. US 2004/0101822 A1 by Wiesner and Ow. The use of such materials is known in the art to produce highly luminescent materials. Single rare earth dopants that can be used are erbium (Er), holmium, thulium, praseodymium, neodymium (Nd) and ytterbium. Some rare-earth co-dopant combinations include ytterbium: erbium, ytterbium:thulium and thulium: praseodymium. Single transition metal dopants are chromium (Cr), thallium (Tl), manganese (Mn), vanadium (V), iron (Fe), cobalt (Co) and nickel (Ni). Other transition metal co-dopant combinations include Cr:Nd and Cr:Er. The upconversion process has been demonstrated in several transparent fluoride crystals and glasses doped with a variety of rare-earth ions. In particular, $CaF_2$ doped with $Er^{3+}$. In this instance, infrared upconversion of the Er3+ ion can be caused to emit two different colors: red (650 nm) and green (550 nm). The emission of the system is spontaneous and isotropic with respect to direction. Organic fluorophores can include dyes such as Rhodamine B, and the like. Such dyes are well known having been applied to the fabrication of organic dye lasers for many years. The preferred organic material for the asymmetrical light emitting resonator 30 is a small-molecular weight organic host-dopant combination typically deposited by high-vacuum thermal evaporation. It is also preferred that the host materials used in the present invention are selected such that they have sufficient absorption of the excitation light 20 and are able to transfer a large percentage of their excitation energy to a dopant material via Förster energy transfer. Those skilled in the art are familiar with the concept of Förster energy transfer, which involves a radiationless transfer of energy between the host and dopant molecules. An example of a useful host-dopant combination for red-emitting lasers is aluminum tris(8-hydroxyquinoline) (Alq) as the host and [4-(dicyanomethylene)-2-t-butyl-6-(1,1,7,7-tetramethyljulolidyl-9-enyl)-4H-pyran] (DCJTB) as the dopant (at a volume fraction of 1%). Other host-dopant combinations can be used for other wavelength emissions. For example, in the green a useful combination is Alq as the host and [10-(2-benzothiazolyl)-2,3, 6,7-tetrahydro-1,1,7,7-tetramethyl-1H,5H,11H-[1] Benzopyrano[6,7,8-ij]quinolizin-11-one] (C545T) as the dopant (at a volume fraction of 0.5%). Other organic light emitting materials can be polymeric substances, e.g., polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references therein.

Figure 2B:
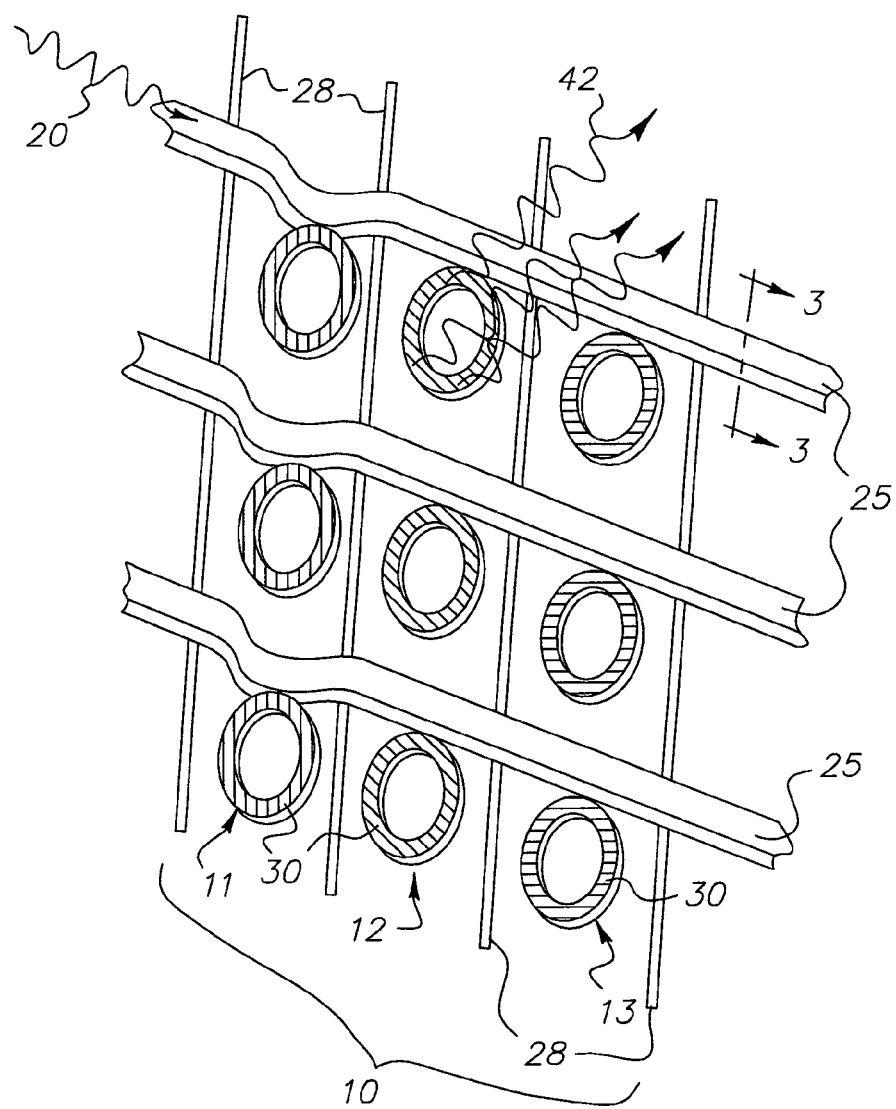
Figure 2C:
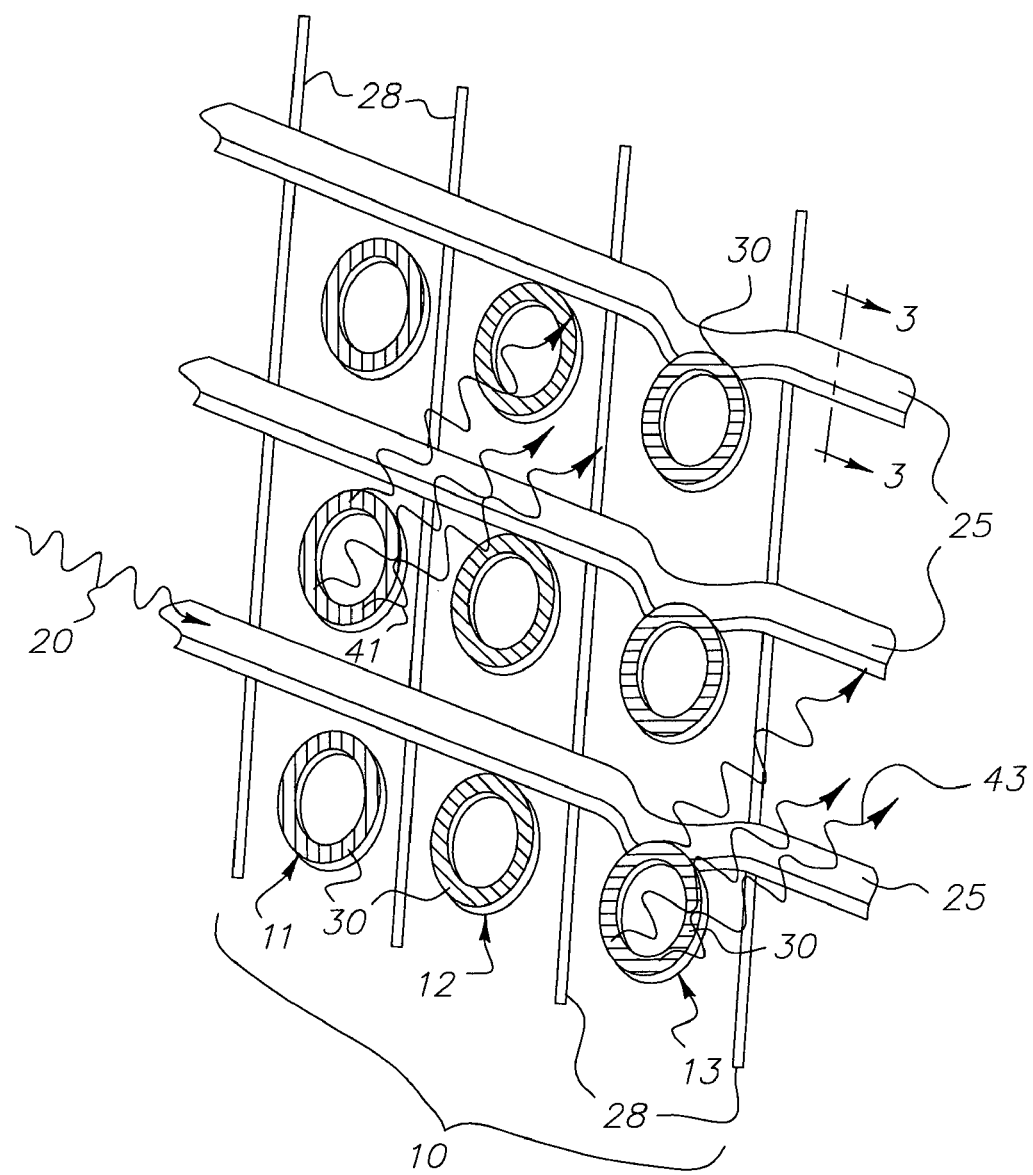

Electro-optical addressing employs the optical row waveguide 25 to deliver light 20 to a selected asymmetrical light emitting resonator 30. The asymmetrical light emitting resonator 30 is the basic building block of the optical flat panel light source 5. Referring now to FIGS. 2A, 2B, and 2C an enlarged top view of a red light 41, green light 42 and blue light 43 asymmetrical light emitting resonator 30 respectively, is illustrated respectively in these figures. Using the red light 41, green light 42 and blue light 43 light emitting resonators to create red 11, green 12, and blue 13 pixels, a full color optical flat panel light source 5 can be formed. The wavelength of the emission of the red, green and blue (41-43) light is controlled by the type of material used in forming the asymmetrical light emitting resonators 30. Selection of a particular pixel 10 or sub-pixel (11-13) is based upon the use of a MEMS device to alter the distance h and affect the degree of power transfer of light 20 to the asymmetrical light emitting resonator 30. Note that in each instance, light 20 is directed within an appropriate optical row waveguide 25 to excite a particular asymmetrical light emitting resonator 30. Through the combination of excitation specific optical row waveguide with light 20 and excitation of a specific MEMS device, controlled by the column electrodes 28, a particular pixel 10 (subpixel) is excited. The asymmetrical light emitting resonator 30 may take the form of a elliptical micro-ring or an elliptical micro-disk. These forms are shown in FIGS. 2A, 2B, 2C, 5A, 5B and 8, respectively. Other asymmetrical forms are possible such as a so-called racetrack or oval ring resonator. Note that in order to increase the brightness of the emitted light from the asymmetrical light emitting resonator 30, the asymmetrical resonator 30 must be fabricated in a manner so that it is 'leaky"; there are a number of methods to accomplish this lowering of the cavity Q, including but not limited to increasing the surface roughness of the resonator cavity surface. Additionally, one could lower the refractive index of the material comprising the asymmetrical light emitting resonator 30.

Figure 3:
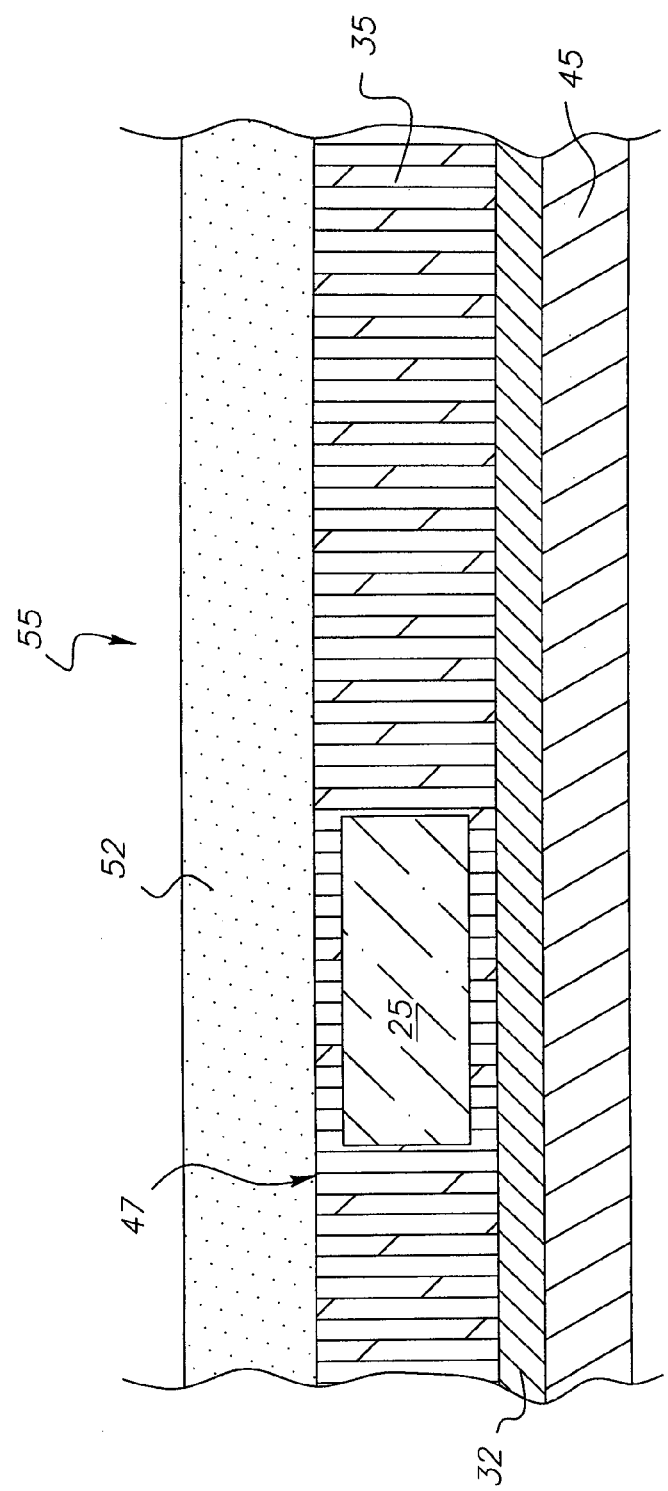
FIG. 3 is an enlarged cross-sectional view of the optical waveguide as taken along line 3-3 of FIG. 2.

The substrate or support 45 (see FIG. 3) can be constructed of either a silicon, glass or a polymer-based substrate material. A number of glass and polymer substrate materials are either commercially available or readily fabricated for this application. Such glass materials include: silicates, germanium oxide, zirconium fluoride, barium fluoride, strontium fluoride, lithium fluoride, and yttrium aluminum garnet glasses. A schematic of an enlarged cross-sectional view of the optical flat panel light source 5 taken along the line 3-3 of FIG. 2A is shown in FIG. 3. The column electrodes 28 are not shown for simplicity. On a substrate 45 is formed a layer 35 containing the optical row waveguide 25 and the asymmetrical light emitting resonator 30. For such a buried-channel waveguide structure it is imperative that the refractive index of optical row waveguide 25 (the core) be greater than the surrounding materials, in this instance the layer 35. The layer 35 acts as the cladding region in this embodiment. An optional layer 32 is shown, this may be of a relatively lower index material in order to better optically isolate the optical row waveguide 25. A top layer 52 is provided on the top surface 47 of layer 35 for protection of the underlying structures. In the case of FIG. 3 the entire structure is shown surrounded by air 55.

Integrated semiconductor waveguide optics and microcavities have raised considerable interest for a wide range of applications, particularly for telecommunications applications. The invention disclosed herein applies this technology to electronic light sources. As stated previously, the energy exchange between cavities and waveguides is strongly dependent on the spatial distance. Controlling the distance between waveguides and microcavities is a practical method to manipulate the power coupling and hence the brightness of a pixel 10 or sub-pixel (11-13).

Figure 4:
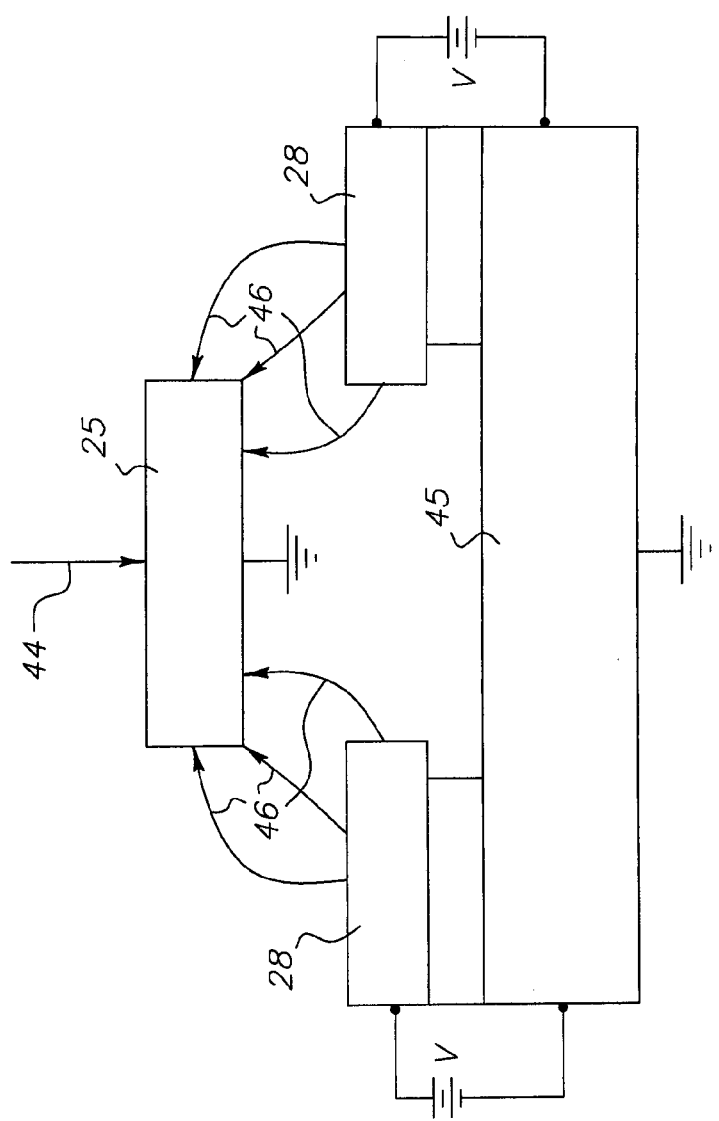
FIG. 4 is an enlarged cross-sectional schematic view of the optical waveguide showing the electrode geometry and electrostatic forces.

An ideal resonator or cavity has characteristics of high quality factor (which is the ratio of stored energy to energy loss per cycle) and small mode volume. Dielectric micro-sphere and micro-toroid resonators have demonstrated high quality factors. Micro-cavities possess potential to construct optical resonators with high quality factor and ultra-small mode volume due to high index-contrast confinement. Small mode volume enables small pixel 10 or sub-pixel (11-13) dimensions, consistent with the requirements of a high resolution light source. A MEMS device structure for affecting the amount of light 20 coupled into a asymmetrical light emitting resonator 30 is shown in FIG. 4. FIG. 4 is an enlarged cross-sectional view of the optical waveguide showing the electrode geometry, field lines 46, and resulting downward electrostatic force 44 for affecting the power coupling change. MEMS actuators using electrostatic forces in this instance, move a waveguide to change the distance h, shown in FIG. 6A between a resonator and the optical row waveguide 25, resulting in a wide tunable range of power coupling ratio by several orders of magnitude which is difficult to achieve by other methods. Based on this mechanism, the micro-disk/waveguide system can be dynamically operated in the under-coupled, critically-coupled and over-coupled condition.

Recently, the optical properties of asymmetrical microdisk resonators have been disclosed in "Highly Directional Emission From Few-Micron-Size Elliptical Microdisks", Applied Physics Letters, 84, 6, ppg. 861-863 (2004), by Sun-Kyung Kim, et. al. Such asymmetrical structures exhibit polarized light emission and directionality with the axis of polarization axis parallel to the major axis of the elliptical structure. The use of such asymmetrical structures to produce polarized light sources is a novel feature of the present invention.

Figure 5A:
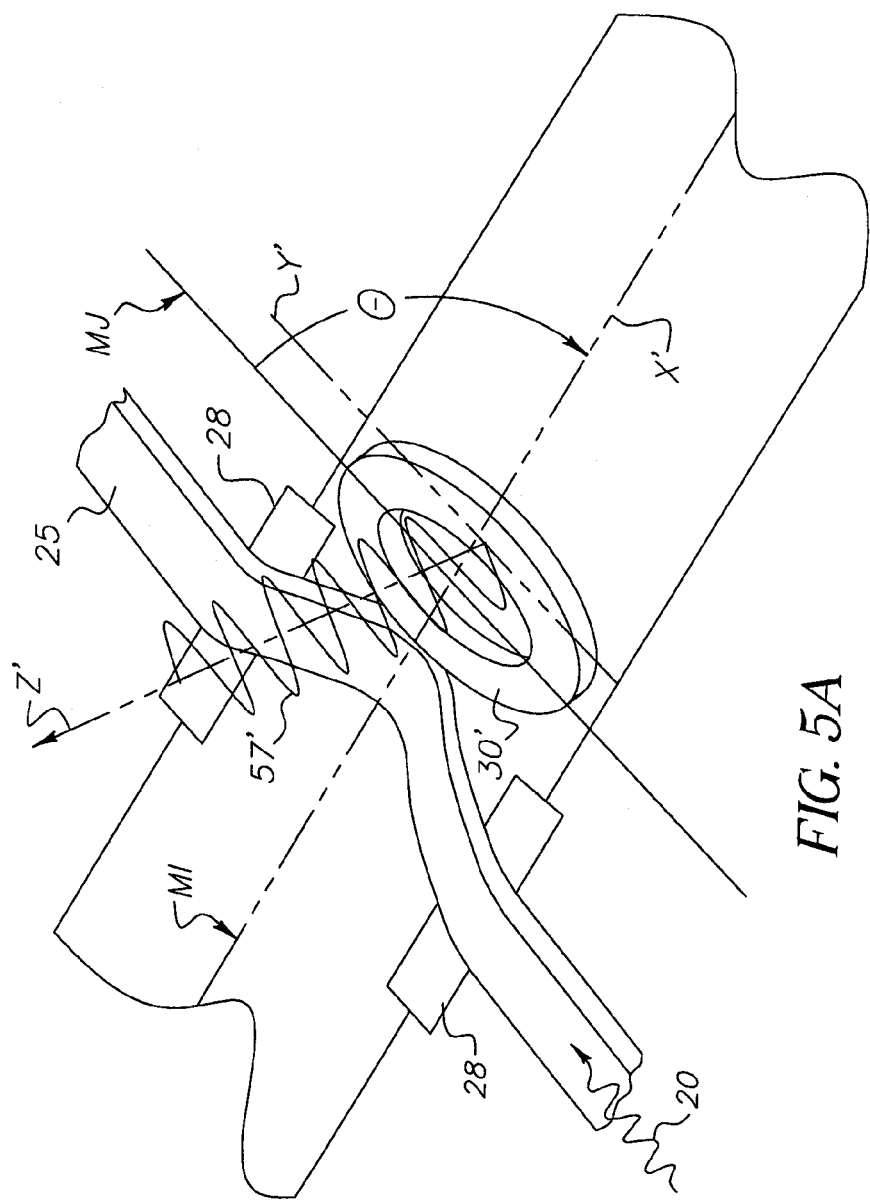
FIG. 5A is an enlarged perspective view of a portion of the light source of FIG. 1 showing a single major axis coupled asymmetrical resonator; single associated optical waveguide and electrodes.

In high-Q micro-resonators, varying the gap spacing or distance h, between the waveguide and the micro-disk or micro-ring resonator by simply a fraction of a micron leads to a very significant change in the power transfer to the asymmetrical light emitting resonator 30 from the optical row waveguide 25. FIG. 5A is an enlarged perspective view of the light source of FIG. 1 showing an asymmetrical light emitting resonator 30; optical waveguide 25, and electrodes 28. As shown in FIG. 5A, a suspended waveguide is placed in close proximity to the asymmetrical light emitting resonator 30. A major axis coupled asymmetrical resonator 30' is shown; the electro-optical coupling region is adjacent to the short or minor axis of the resonator. The initial gap (not shown) (~1 μm wide) is large so there is no coupling between the waveguide and the resonator. Referring to FIG. 5A, the suspended optical row waveguide 25 can be pulled towards the asymmetrical light emitting resonator by four electrostatic gap-closing actuators, the electrodes 28. Therefore, the coupling coefficient can be varied by applied voltage. For high index-contrast waveguides, the coupling coefficient is very sensitive to the critical distance. 1-um displacement can achieve a wide tuning range in power coupling ratio, which is more than five orders of magnitude. Typically, diameters of the resonators are in the range of 2 to 10 microns; elliptical microdisks may have a typical major axis of similar dimensions and ellipticities of ~0.80. But these sizes may vary depending upon the light source type and application, and the materials used to fabricate the structure. In FIG. 5A the optical waveguide 25 is shown displaced downward so as to affect a maximum power transfer to the asymmetrical light emitting resonator 30.

A polarized light wave 57' is depicted in FIG. 5A, having been emitted from the asymmetrical light emitting resonator 30'. Only one of many such polarized light waves 57' is depicted for clarity. The polarized light wave 57' is shown propagating in the z' direction; an x', y', z' right hand coordinate system is shown in FIG. 5A for reference purposes. The emitted polarized light wave 57' is shown with its polarization direction shown as in the y'-z' plane, which is parallel to the major axis MJ. Other emitted polarized light waves 57' would be similarly polarized from the asymmetrical light emitting resonator 30', having their polarization axes parallel to the major axis of the asymmetrical light emitting resonator 30'. Note that a major axis coupled asymmetrical resonator 30' is shown; the electro-optical coupling region is adjacent to the long or major axis MJ of the resonator 30'. In the embodiment illustrated the major axis MJ is substantially parallel to the waveguide 25 and the minor axis MI is orientated at an angle θ of 90 degrees with respect to the waveguide 25

Figure 5B:
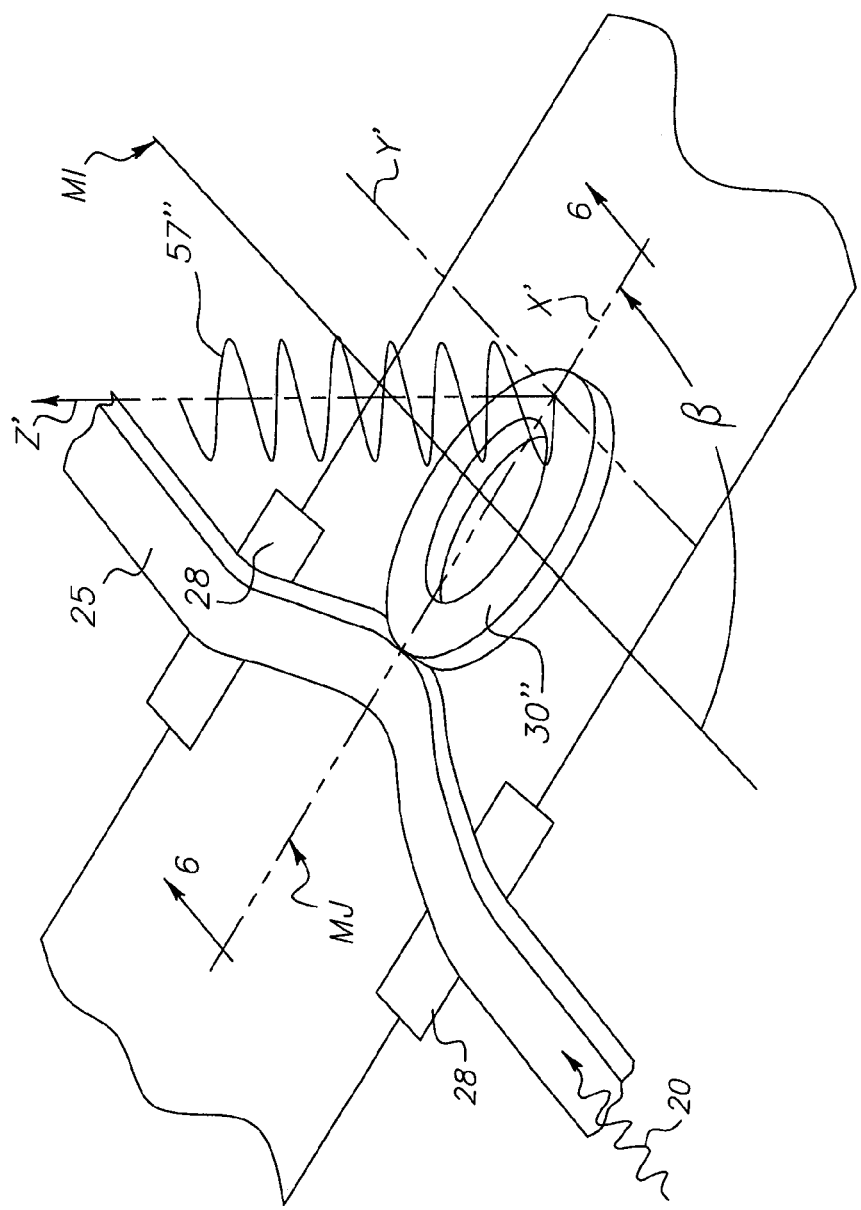
FIG. 5B is an enlarged perspective view of a portion of the light source of FIG. 1 showing a minor axis coupled asymmetrical resonator; single associated optical waveguide and electrodes.

FIG. 5B is an enlarged perspective view of the light source of FIG. 1 showing a minor axis asymmetrical light emitting resonator 30"; optical waveguide 25, and electrodes 28. FIG. 5B shows an asymmetrical light emitting resonator 30" oriented at 90 degrees to the configuration shown in FIG. 5A. In this embodiment the minor axis MI is substantially parallel to the waveguide 25 and the major axis MJ is at an angle β of 90 degrees with respect to the waveguide 25. Again a single polarized light wave 57" is shown for clarity, propagating in the z' direction. Note that for this configuration, the polarization of the polarized light wave 57" is in the x'-z' plane, which is parallel to the major axis MJ. Other emitted polarized light waves 57" would be similarly polarized from the asymmetrical light emitting resonator 30", having their polarization axes parallel to the major axis of the asymmetrical light emitting resonator 30". Note that a minor axis coupled asymmetrical resonator 30" is shown; the electro-optical coupling region is adjacent to the short or major minor of the resonator.

Figure 5C:
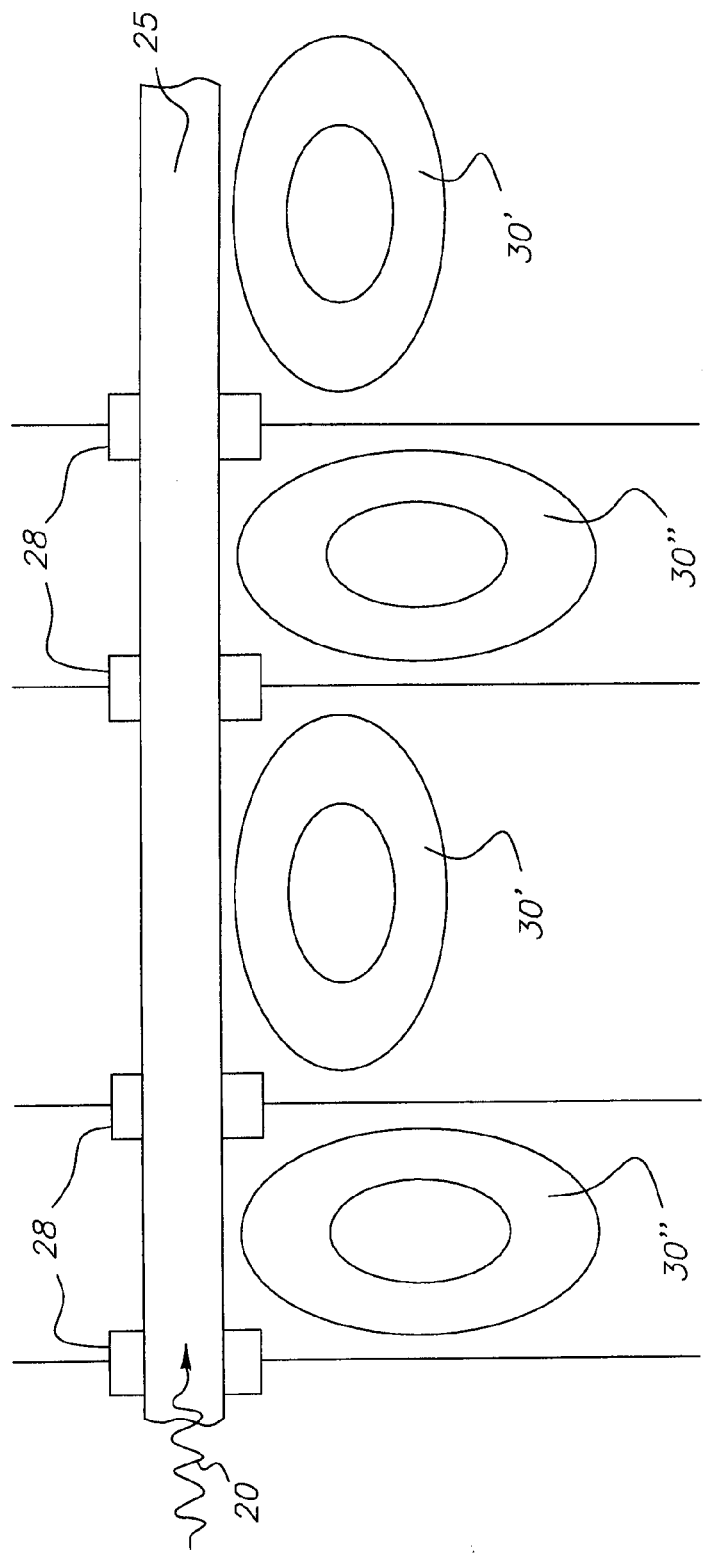
FIG. 5c is an enlarged perspective view of a portion of the light source of FIG. 1 showing a multiplicity of both major and minor axis coupled asymmetrical resonators; single associated optical waveguide and electrodes.
Figure 9:
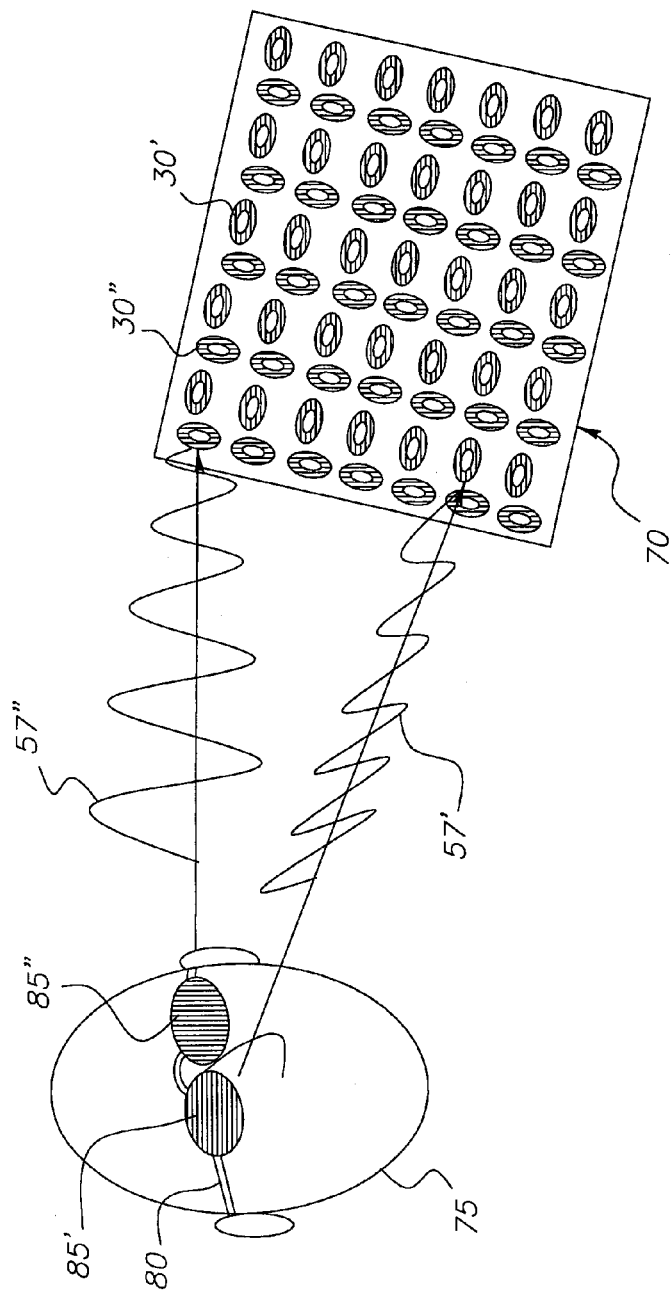
FIG. 9 is a diagrammatic view illustrating a stereoscopic viewer made in accordance with the present invention.

FIG. 5C is an enlarged perspective view of a portion of the light source of FIG. 1 showing a row of alternating major 30' and minor 30" axis coupled asymmetrical light emitting resonators with their associated optical waveguide 25 and electrodes 28. In such a light source the polarization of the emitted light would alternate from vertical to horizontal as one moved across the light source from left to right in FIG. 5C. Because the light emission from individual asymmetrical light emitting resonators 30 is individually controlled the polarization character of the light can also be controlled. This control can be beneficial to a number of applications. For example as shown in FIG. 9, a stereoscopic display 70 made in accordance with the present invention could be constructed using this light source embodiment with a viewer 75 having glasses 80 with polarizing elements 85' and 85" selective to one or the other polarization state (vertical or horizontal respectively) from the light source. Clearly other patterns of these asymmetrical light emitting resonators are possible and are considered within the scope of this invention. For example, but not by way of limitation, the light emitting resonators may comprise three adjacent resonators in the same direction and the next three in the 90 degree orientation. Likewise, three adjacent rows may be the same or alternate by one, two or as many rows as appropriate to meet the desired effect. While in the embodiment illustrated the light emitting resonators are oriented at predetermined angle differential of 90 degrees other angle relationships may be employed again to obtain the desired effect. In the embodiment illustrated two different orientations were provided for the light emitting resonators, it is contemplated that three or any desired number of orientations may be provided to provided the desired affect. This could results in different individuals using different glasses viewing different or personalized images.

Figure 6A:
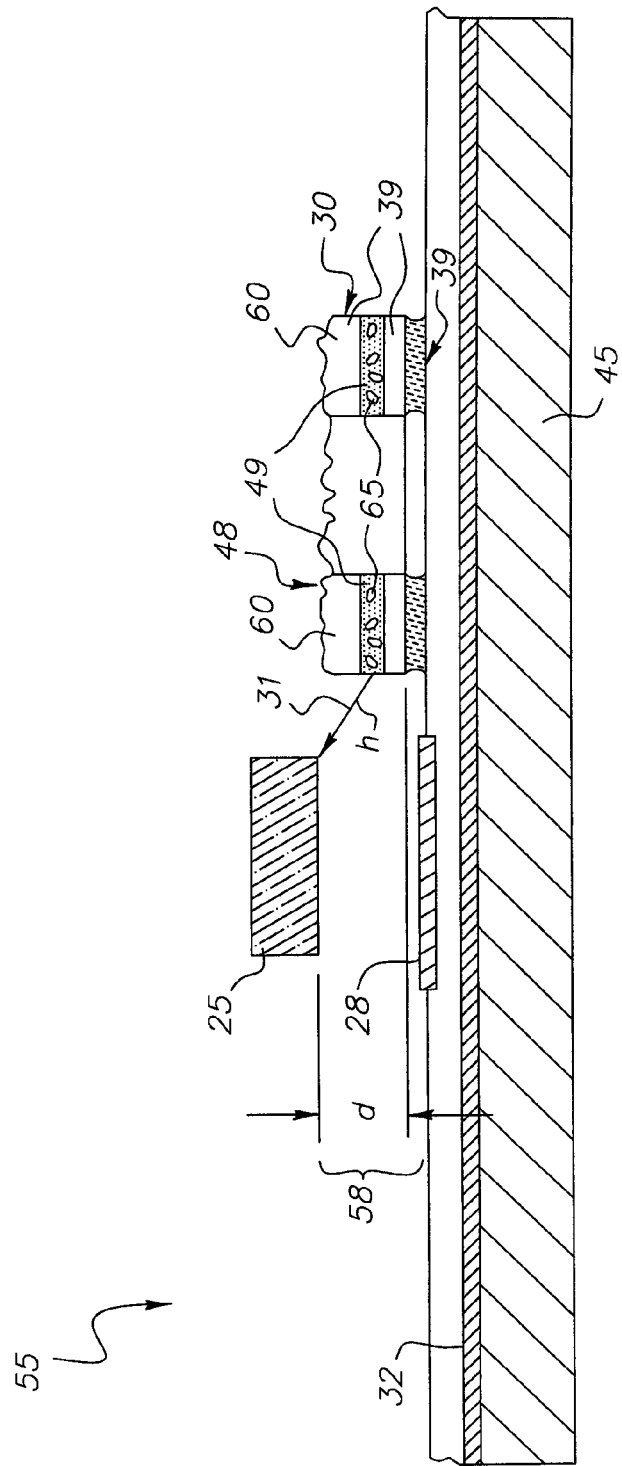
FIGS. 6A, B and C are an enlarged cross-sectional view of the light source of FIG. 5B taken along line 6-6 of FIG. 5B, which shows the location of a MEMS device used to control the pixel intensity at various intensity positions.

FIG. 6A is an enlarged cross-sectional view of the light source of FIG. 5B, which shows the location of a MEMS device used to control the pixel intensity. The area surrounding the optical row waveguide 25 and the light emitting ring resonator 30 has been etched back to expose the top surfaces 48 to air 55. The optical row waveguide 25 is aligned to the edge of the asymmetrical light emitting resonator 30 and vertically displaced to preclude a high degree of coupling. The waveguide 25 is electrically grounded and actuated by a pair of electrodes 28 at the two ends, which forms an electro-coupling region 58. Due to the electrostatic force, the waveguide is pulled downward toward the asymmetrical light emitting resonator 30, resulting in the decreased gap-spacing, h. The optical row waveguide 25 is shown in the rest position d in FIG. 6A. In FIG. 6A, the distance between the optical row waveguide 25 and the asymmetrical light emitting ring resonator 30 is large; coupling of light into the asymmetrical light emitting resonator 30 is precluded and there is no light emission from the pixel.

Figure 6B:
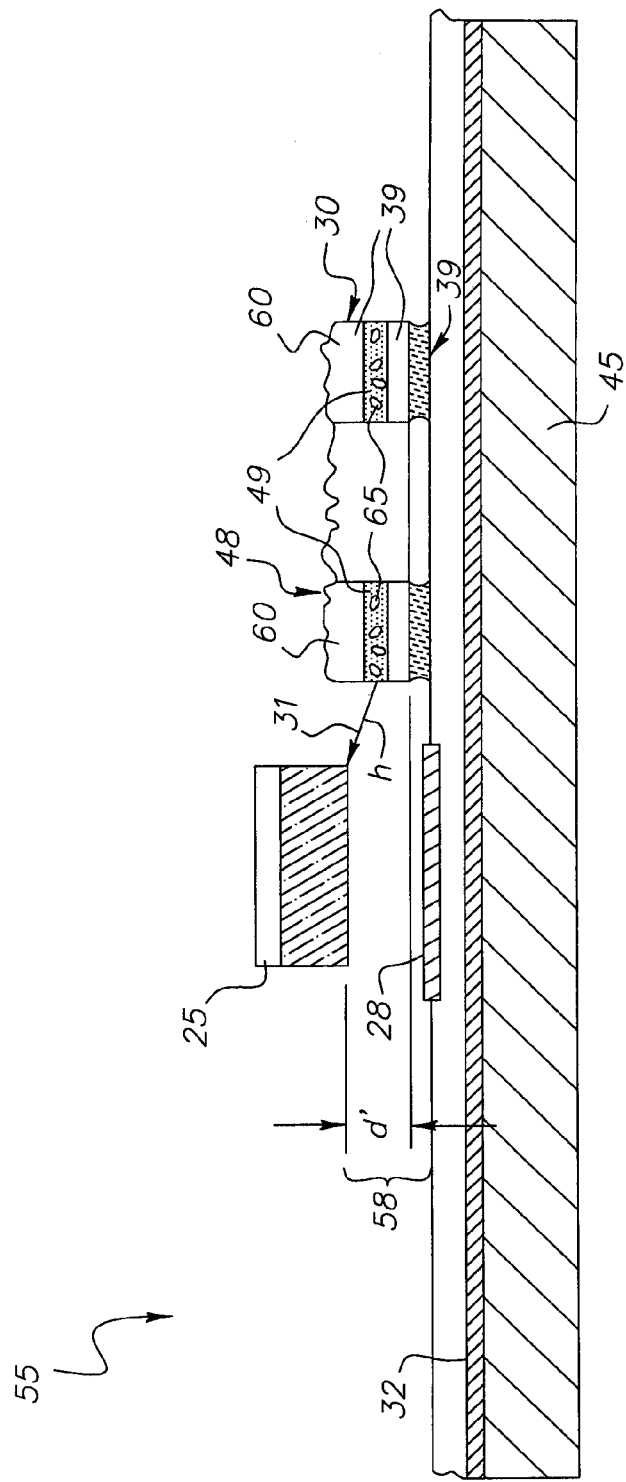
Figure 6C:
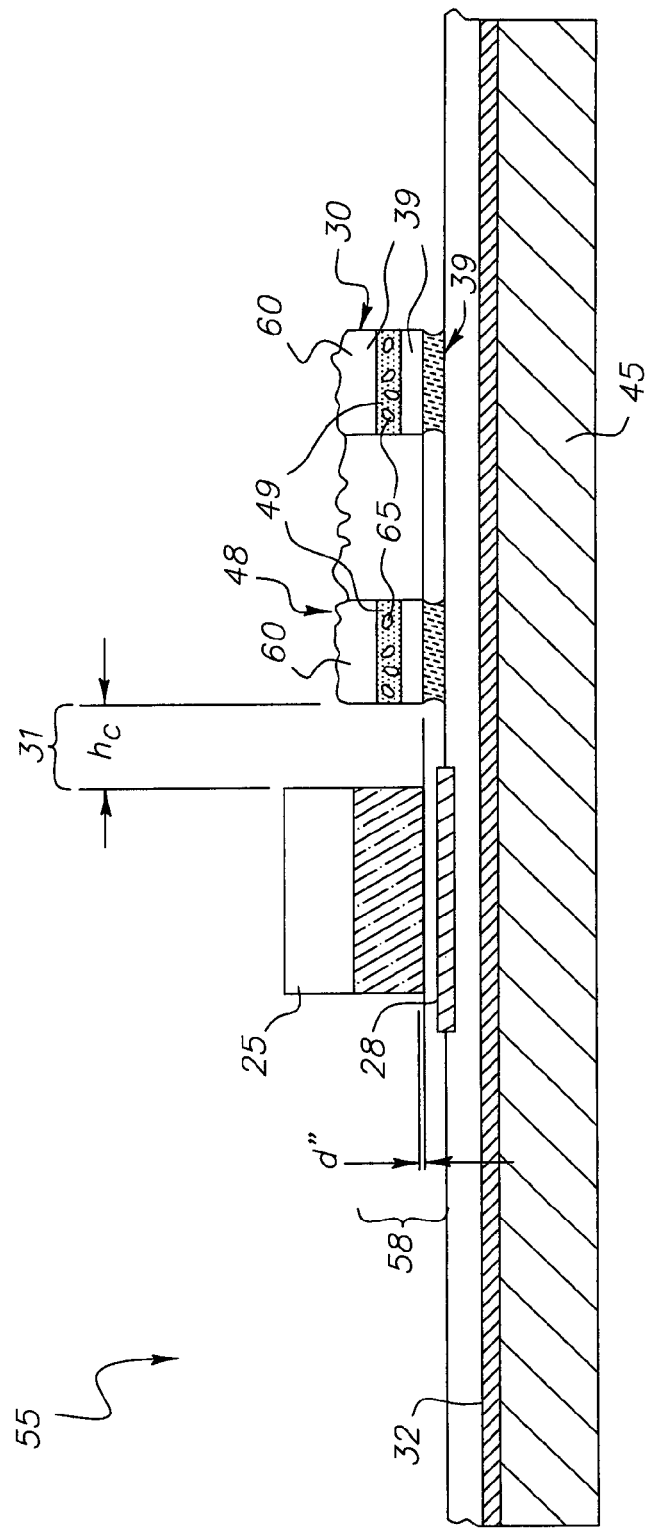

Initially, in the absence of the application of the control voltage, the optical row waveguide 25 is separated from the asymmetrical light emitting resonator by a distance significantly greater than the critical distance "$h_c$" 31 (see FIG. 6C.) and hence there is no light emission from the asymmetrical light emitting resonator 30. In FIG. 6B, the vertical distance d' is shown where there exists a degree of coupling between the optical row waveguide 25 and the asymmetrical light emitting ring resonator 30, and hence light emission from the pixel occurs. By varying the distance d', the intensity of the light emission from the pixel can be varied in a controllable manner. In FIG. 6C, the distance d" is shown that corresponds to the displacement of the optical row waveguide 25 necessary to place the optical row waveguide 25 at the critical coupling distance $h_c$ and thereby optimize power coupling. This configuration will produce the maximum emitted light intensity from the pixel. Note that asymmetrical light emitting resonator is shown with a roughened surface 60; this will be discussed below. The optical row waveguide can be fabricated from silicon appropriately doped to provide electrical conductivity. Alternatively, the optical row waveguide can be fabricated from other optically transparent conductive materials such as polymers that meet the optical index of refraction requirement disclosed above.

In the embodiment shown in FIG. 6C, the asymmetrical light emitting resonator 30 is shown spaced the critical distance 31, "$h_c$" from the optical row waveguide 25. Excitation light 20 is emitted from top roughened surface 60 of the asymmetrical light emitting resonator 30, which causes the asymmetrical light emitting resonator to leak light. As shown in FIG. 6C, a light emitting layer 49 is placed within the asymmetrical light emitting resonator. This layer 49 contains photo-luminescent species or lumiphores 65 that absorb the pump or excitation light 20 and via the luminescence processes discussed above, produce the visible light directed to the viewer. The wavelength of the light produced in the emitting layer 49 is determined by the material composition as previously disclosed. The light emitting layer 49 may be formed on the top surface of the asymmetrical light emitting resonator 30 as well as placed within the internal structure of the asymmetrical light emitting resonator as is shown in FIG. 6C. FIG. 6C shows the emitting layer 49 displaced vertically from the bottom surface 39 of asymmetrical light emitting resonator 30.

Figure 7:
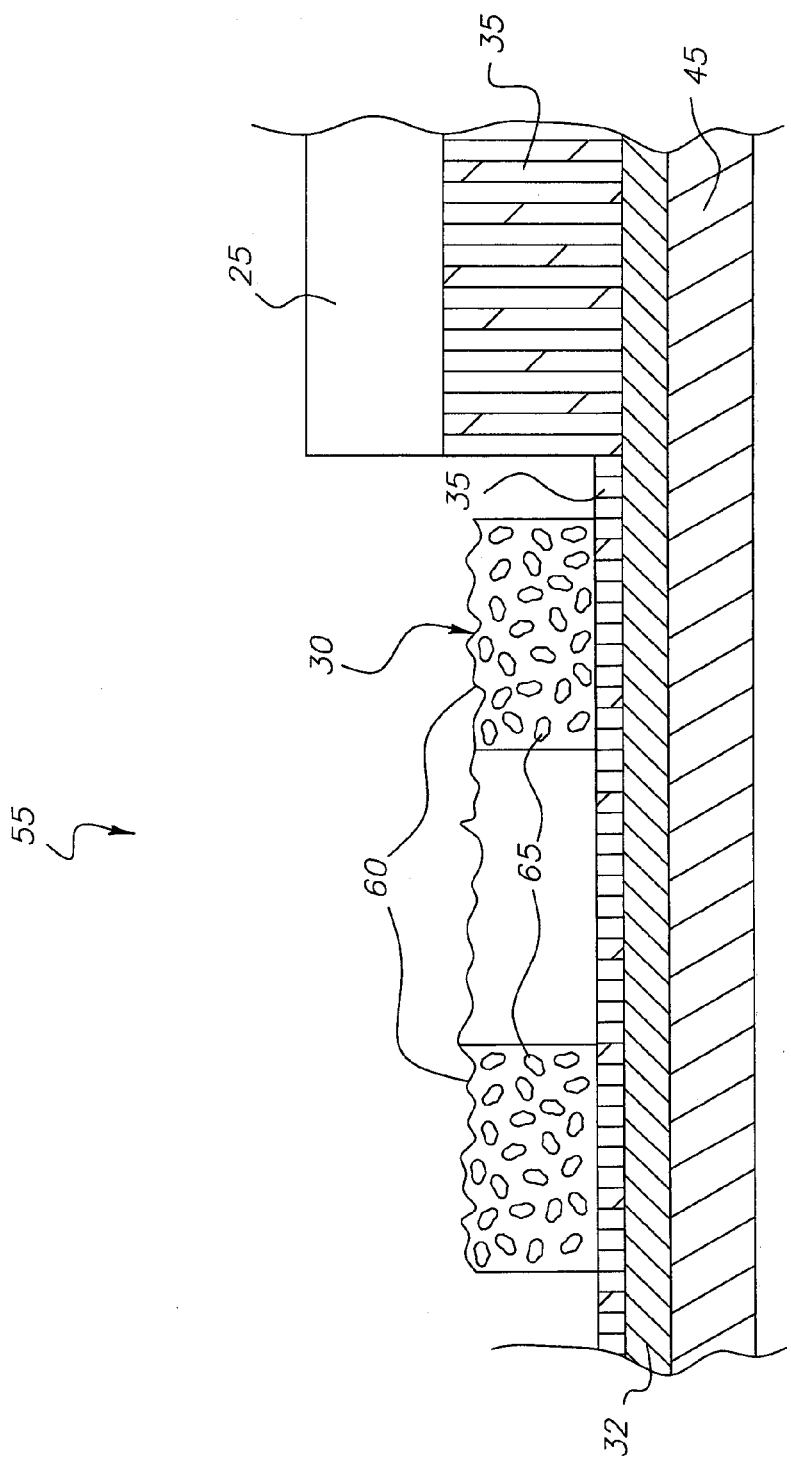
FIG. 7 is an enlarged cross-sectional view of the waveguide and resonator elements showing an alternative embodiment for the light-emissive resonator.

FIG. 7 is an enlarged cross-sectional view of the resonator elements showing an alternative embodiment for the asymmetrical light emitting resonator 30. In this embodiment the lumiphores 65 are shown uniformly distributed within the asymmetrical light emitting resonator 30.

Figure 8:
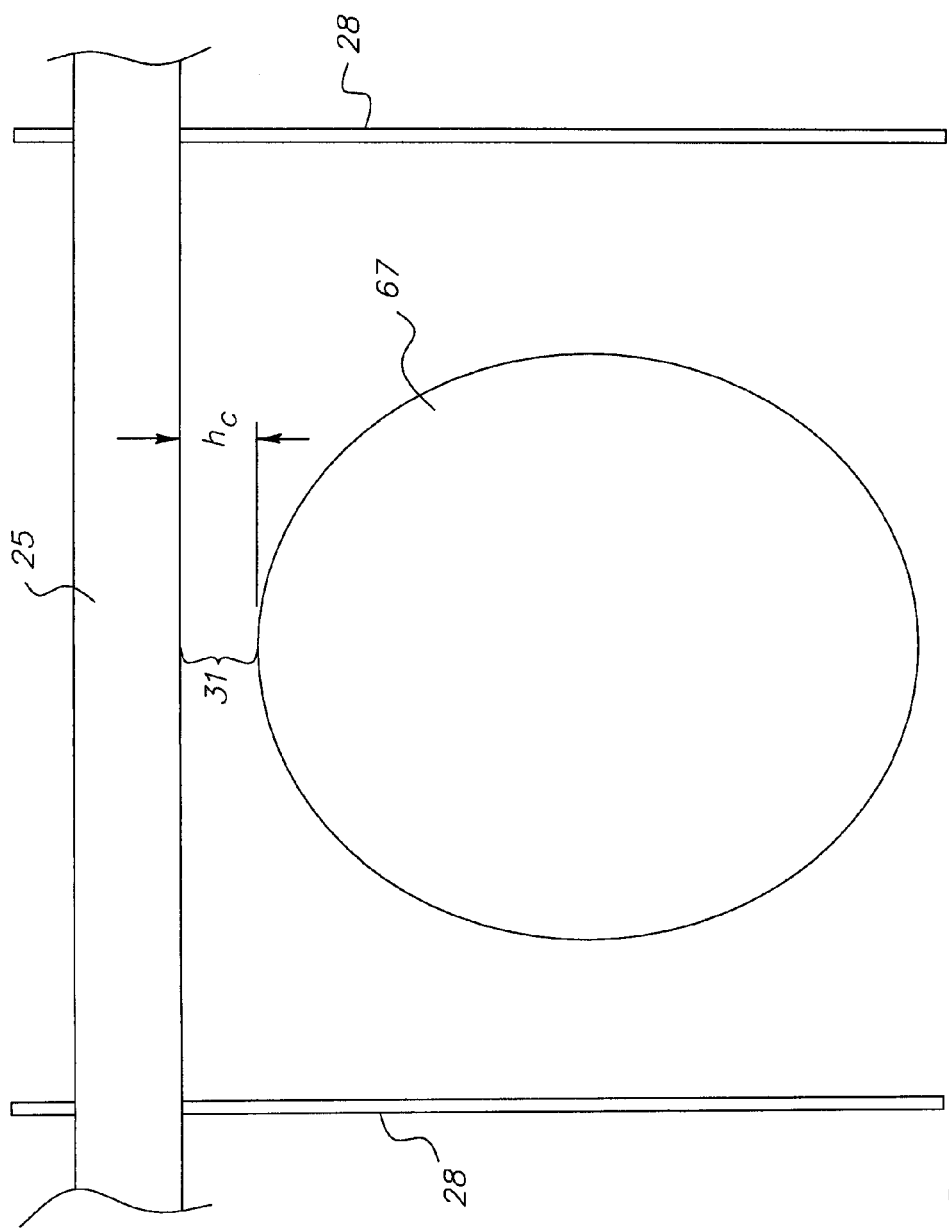
FIG. 8 is an enlarged top plan view showing an alternative resonator embodiment in the form of a disk.

FIG. 8 is an enlarged top plan view showing an alternative resonator embodiment in the form of an elliptical disk. The critical distance "$h_c$" 31 is shown as well as the asymmetrical light emitting disk 67 resonator. A number of structures have been demonstrated for the resonator element including ring, disk, elliptical and racetrack or oval structures. The coupling of optical power into such structures is well known to those skilled in the art. The use of such structures as asymmetrical light emitting resonators is considered within the scope of this invention.

The invention has been described with reference to a preferred embodiment; however, it will be appreciated that variations and modifications can be affected by a person of ordinary skill in the art without departing from the scope of the invention. In particular, it is well known in the art that the optical row waveguide 25 can be placed adjacent to the asymmetrical light emitting resonator 30 in the same horizontal plane, and tuned for power transfer by affecting a lateral, that is in-plane or horizontal displacement, rather than the vertical displacements depicted above. Additionally, it may be advantageous to place the optical row waveguide 25 above the asymmetrical light emitting resonator 30 adjacent to the periphery of the asymmetrical light emitting resonator 30. In this latter case the electro-coupling region 58 would be placed vertically above the edge of the asymmetrical light emitting resonator 30 and power transfer affected by a vertical displacement of the optical row waveguide 25 relative to the top surface of the asymmetrical light emitting resonator 30. Many other such variations are possible and considered within the scope of this invention.

What is claimed is:

1. A light source device, comprising:
   a. a support substrate;
   b. a plurality of asymmetrical light emitting resonators placed in a matrix on said support substrate forming a plurality of rows and columns of said asymmetrical light emitting resonators;
   c. a plurality of light waveguides positioned on said substrate such that each of said asymmetrical light emitting resonators is associated with an electro-coupling region with respect with to one of said plurality of light waveguides;
   d. a deflection mechanism for causing relative movement between a portion of at least one of said plurality of light waveguides and said associated asymmetrical light emitting resonator for controlling when said asymmetrical light emitting resonator is in said electro-coupling region; and
   e. a light source associated with each of said plurality of light waveguides for transmitting a light along said plurality of light waveguides for selectively activating each of said asymmetrical light emitting resonators when positioned within said electro-coupling region.

2. A light source device according to claim 1 wherein said light source comprises an infrared light source.

3. A light source device according to claim 2 wherein said infrared light source comprises a laser infrared light source.

4. A light source device according to claim 1 wherein said light source comprises a light emitting diode.

5. A light source device according to claim 1 wherein said plurality of asymmetrical light emitting resonators in at least one row have a major axis and a minor axis and are positioned in said at least one row such that the said major and minor axis alternate with respect to their associated waveguide.

6. A light source device according to claim 5 wherein said asymmetrical light emitting resonators have a roughened surface.

7. A light source device according to claim 1 wherein said plurality of asymmetrical light emitting resonators have a major and minor axis and positioned with respect to their associated waveguide such that a predetermined number of said plurality of asymmetrical light emitting resonators have their major axis positioned at first predetermined angle with respect to its associated waveguide and second predetermined number having their major axis positioned a second predetermined angle different from said first predetermined angle.

8. A light source device according to claim 7 wherein said asymmetrical light emitting resonators comprises an upconverting phosphor.

9. A light source device according to claim 7 wherein said plurality of asymmetrical light resonators have a roughened surface and an emissive coating is provided over said roughened surface.

10. A light source device according to claim 1 wherein said first predetermined angle is about 90 degrees and said second predetermined angle is about 0 degrees.

11. A light source device according to claim 1 wherein an overcoat is provided over said plurality of asymmetrical light emitting resonators and light waveguides.

12. A light source device according to claim 1 wherein said deflection mechanism comprises at least one electrode provided for deflection said portion of said waveguides.

13. A light source device according to claim 1 wherein said deflection mechanism comprises at pair of electrode provided for deflection said portion of said waveguides.

14. A light source device according to claim 1 wherein said deflection mechanism comprises pair of electrodes disposed on both sides of at least one of asymmetrical light emitting resonator and passing adjacent with at least one of said of said plurality of light waveguides whereby when a voltage is applied across said pair of electrodes a field is produced that causes said at least one waveguide to move into said electro-coupling region.

15. A light source device according to claim 14 wherein a control mechanism is provided for controlling the amount of said voltage across said pair of electrodes for controlling the distance in which said at least one waveguide moves into said electro-coupling region so as to control the amount of emission from said associated asymmetrical light emitting resonator.

16. A light source device according to claim 1 wherein said plurality of asymmetrical light emitting resonator are grouped into sets wherein in each comprises a leaky resonator in each group emit a different color.

17. A light source device according to claim 1 wherein at least one of said plurality of asymmetrical light emitting resonators having an elliptical shape.

18. A light source device according to claim 1 wherein at least one said plurality of asymmetrical light emitting resonators is disc shaped.

19. A method for controlling visible light emitting from a light source device having plurality of asymmetrical light emitting resonators placed in a pattern forming a plurality of rows and columns and a plurality of wave light guides positioned so that each of said asymmetrical light emitting resonators is positioned adjacent one of said plurality of wave light guides; comprising the steps of:
  a. providing a light source associated with each of said plurality of light waveguides for transmitting a light along said associated light waveguide;
  b. providing deflection mechanism for causing relative movement between a portion of at least one of said plurality of light waveguides and said associated asymmetrical light emitting resonator so as to control when said asymmetrical light emitting resonator is in said electro-coupling region;
  c. selectively controlling emission of visible light from said plurality of asymmetrical light emitting resonators by controlling said deflection mechanism and light source such that when said asymmetrical light emitting resonator in said electro-coupling region and a light is transmitted along said associated light waveguide said emission of visible light will occur.

20. The method according to claim 19 wherein deflection mechanism for causing relative movement comprises a pair of electrodes associated with each or said plurality of asymmetrical light emitting resonators, further comprising the step of controlling the amount of relative movement by controlling a voltage applied across said pair of electrodes.

21. The method according to claim 20 wherein at least one of said plurality of asymmetrical light emitting resonators having an elliptical shape.

22. The method according to claim 19 wherein said light source comprises an infrared light source.

23. The method according to claim 22 wherein said infrared light source comprises a laser infrared light source.

24. The method according to claim 19 wherein said light source comprises a light emitting diode.

25. The method according to claim 19 wherein said deflection mechanism comprises at least one electrode provided for deflection said portion of said waveguides.

26. The method according to claim 19 wherein said deflection mechanism comprises a pair of electrode provided for deflection said portion of said waveguides.

27. The method according to claim 19 wherein said deflection mechanism comprises pair of electrodes disposed on both sides of at least one of asymmetrical light emitting resonator and passing adjacent with at least one of said of said plurality of light waveguides whereby when a voltage is applied across said pair of electrodes a field is produced that causes said at least one waveguide to move into said electro-coupling region.

28. The method according to claim 19 wherein a control mechanism is provided for controlling the amount of voltage across said pair of electrodes for controlling the distance in which said at least one waveguide moves into said electro-coupling region so as to control the amount of emission from said associated asymmetrical light emitting resonator.

29. The method according to claim 19 wherein said plurality of asymmetrical light emitting resonator are grouped into sets wherein in each of said light emitting resonators emit a different color.

30. The method according to claim 19 wherein said plurality of asymmetrical light emitting resonators in at least one row have a major axis and a minor axis and are positioned in said at least one row such that the said major and minor axis alternate with respect to their associated waveguide.

31. The method according to claim 19 wherein said plurality of asymmetrical light emitting resonators have a major and minor axis and positioned with respect to their associated waveguide such that a predetermined number of said plurality of asymmetrical light emitting resonators have their major axis positioned at first predetermined angle with respect to its associated waveguide and second predetermined number having their major axis positioned a second predetermined angle different from said first predetermined angle.

32. A light source device according to claim 19 wherein said first predetermined angle is about 90 degrees and said second predetermined angle is about 0 degrees.

33. A system for viewing a stereoscopic image, comprising:
   a. an image display device, having a plurality of asymmetrical light emitting resonators placed in a matrix, each of said plurality of asymmetrical light emitting resonators having a major axis and a minor axis, said plurality of asymmetrical light emitting resonators being placed in a pattern such that a polarized image is produced in two different polarized directions, said display comprising;
   a plurality of light waveguides positioned on said substrate such that each of said asymmetrical light emitting resonators is associated with an electro-coupling region with respect with to one of said plurality of light waveguides;
   a deflection mechanism for causing relative movement between a portion of at least one of said plurality of light waveguides and said associated asymmetrical light emitting resonator so as to control when said asymmetrical light emitting resonator is in said electro-coupling region; and
   a light source associated with each of said plurality of light waveguides for transmitting a light along said plurality of light waveguides for selectively activating each of said asymmetrical light emitting resonators when positioned within said electro-coupling region; and
   b. a viewing device having a polarizing element for viewing the polarized image for each of said different polarized directions.

34. The system according to claim 33 wherein said matrix comprises a plurality of rows and columns of said asymmetrical light emitting resonators.

35. The system according to claim 34 wherein said plurality of asymmetrical light emitting resonators in at least one row have a major axis and a minor axis and are positioned in said at least one row such that the said major and minor axis alternate with respect to their associated waveguide.

36. The system according to claim 34 wherein said plurality of asymmetrical light emitting resonators have a major and minor axis and positioned with respect to their associated waveguide such that a predetermined number of said plurality of asymmetrical light emitting resonators have their major axis positioned at first predetermined angle with respect to its associated waveguide and second predetermined number having their major axis positioned a second predetermined angle different from said first predetermined angle.

37. The system according to claim 34 wherein said first predetermined angle is about 90 degrees and said second predetermined angle is about 0 degrees.

38. The system according to claim 33 wherein said display is a color display.

39. The system according to claim 33 wherein said display is a monochrome display.

40. The system according to claim 33 wherein said viewing device comprises a pair of eye glasses.

41. The system according to claim 33 wherein said viewing device comprises a rotating polygon mirror with different polarized facets that correspond to the two different polarized directions.

42. A display device for producing an stereoscopic image, comprising:
   a plurality of asymmetrical light emitting resonators placed in a matrix, each of said plurality of asymmetrical light emitting resonators having a major axis and a minor axis, said plurality of asymmetrical light emitting resonators being placed in a pattern such that an polarized image is produced in two different polarized directions;
   a plurality of light waveguides positioned on said substrate such that each of said asymmetrical light emitting resonators is associated with an electro-coupling region with respect with to one of said plurality of light waveguides;
   a deflection mechanism for causing relative movement between a portion of at least one of said plurality of light waveguides and said associated asymmetrical light emitting resonator so as to control when said asymmetrical light emitting resonator is in said electro-coupling region; and
   a light source associated with each of said plurality of light waveguides for transmitting a light along said plurality of light waveguides for selectively activating each of said asymmetrical light emitting resonators when positioned within said electro-coupling region.

43. The display device according to claim 42 wherein said matrix comprises a plurality of rows and columns of said asymmetrical light emitting resonators.

44. The display device according to claim 43 wherein said plurality of asymmetrical light emitting resonators in at least one row have a major axis and a minor axis and are positioned in said at least one row such that the said major and minor axis alternate with respect to their associated waveguide.

45. The display device according to claim 43 wherein said plurality of asymmetrical light emitting resonators have a major and minor axis and positioned with respect to their associated waveguide such that a predetermined number of said plurality of asymmetrical light emitting resonators have their major axis positioned at first predetermined angle with respect to its associated waveguide and second predetermined number having their major axis positioned a second predetermined angle different from said first predetermined angle.

46. The display device according to claim 43 wherein said first predetermined angle is about 90 degrees and said second predetermined angle is about 0 degrees.

47. The display device according to claim 42 wherein said display device is a color display.

48. The display device according to claim 42 wherein said display device is a monochrome display.

49. A method for producing a stereoscopic image, comprising the steps of:
   a. providing a single image display device having a plurality of asymmetrical light emitting resonators placed in a pattern that produces an image two different polarized directions; wherein said display's device comprises;

a plurality of light waveguides positioned on said substrate such that each of said asymmetrical light emitting resonators is associated with an electro-coupling region with respect with to one of said plurality of light waveguides;

a deflection mechanism for causing relative movement between a portion of at least one of said plurality of light waveguides and said associated asymmetrical light emitting resonator so as to control when said asymmetrical light emitting resonator is in said electro-coupling region; and a light source associated with each of said plurality of light waveguides for transmitting a light along said plurality of light waveguides for selectively activating each of said asymmetrical light emitting resonators when positioned within said electro-coupling region.

50. The method according to claim 49 wherein said matrix comprises a plurality of rows and columns of said asymmetrical light emitting resonators.

51. The method according to claim 50 wherein said plurality of asymmetrical light emitting resonators in at least one row have a major axis and a minor axis and are positioned in said at least one row such that the said major and minor axis alternate with respect to their associated waveguide.

52. The method according to claim 50 wherein said plurality of asymmetrical light emitting resonators have a major and minor axis and positioned with respect to their associated waveguide such that a predetermined number of said plurality of asymmetrical light emitting resonators have their major axis positioned at first predetermined angle with respect to its associated waveguide and second predetermined number having their major axis positioned a second predetermined angle different from it associated waveguide.

53. The method according to claim 50 wherein said first predetermined angle is about 90 degrees and said second predetermined angle is about 0 degrees.

54. The method according to claim 49 wherein said display device is a color display.

55. The method according to claim 49 wherein said display device is a monochrome display.

* * * * *